(12) United States Patent
Kimura

(10) Patent No.: US 10,003,332 B2
(45) Date of Patent: Jun. 19, 2018

(54) DRIVE CONTROL DEVICE AND DRIVE CONTROL METHOD

(71) Applicant: KABUSHIKI KAISHA TOSHIBA, Tokyo (JP)

(72) Inventor: Hideki Kimura, Yokohama Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days. days.

(21) Appl. No.: 15/438,445

(22) Filed: Feb. 21, 2017

(65) Prior Publication Data
US 2018/0069547 A1    Mar. 8, 2018

(30) Foreign Application Priority Data

Sep. 7, 2016 (JP) .................................. 2016-175046

(51) Int. Cl.
| H03K 17/04 | (2006.01) |
| H03K 17/68 | (2006.01) |
| H03K 17/687 | (2006.01) |
| H03K 5/19 | (2006.01) |
| H03K 5/156 | (2006.01) |
| H03K 19/0175 | (2006.01) |

(52) U.S. Cl.
CPC ....... *H03K 17/6872* (2013.01); *H03K 5/1565* (2013.01); *H03K 5/19* (2013.01); *H03K 19/017509* (2013.01)

(58) Field of Classification Search
CPC ........ H03K 5/19; H03K 5/156; H03K 5/1565; H03K 17/0412; H03K 17/04123; H03K 17/0416; H03K 17/04163; H03K 17/687; H03K 17/6872; H03K 2217/0036
See application file for complete search history.

(56) References Cited

U.S. PATENT DOCUMENTS

| 5,126,603 A * | 6/1992 | Hattori | ............... H03K 17/0822 327/1 |
| 5,287,046 A * | 2/1994 | Carpenter | .............. G11B 21/02 318/293 |
| 7,741,794 B2 * | 6/2010 | Nishibe | ................... B60R 1/074 318/254.1 |

FOREIGN PATENT DOCUMENTS

| JP | S62221876 A | 9/1987 |
| JP | H11316249 A | 11/1999 |
| JP | 2012182921 A | 9/2012 |

* cited by examiner

*Primary Examiner* — An Luu
(74) *Attorney, Agent, or Firm* — Patterson & Sheridan, LLP

(57) ABSTRACT

A drive control device includes a MOS transistor, voltage measuring circuits, a correction circuit, and a control circuit. The voltage measuring circuits measure a drain-to-source voltage when a forward drain current flows through the MOS transistor and when a reverse drain current flows in the MOS transistor. The correction circuit sets a current setting voltage level when the reverse drain current flows, where the current setting voltage level is proportional to the voltage between the drain and the source when a predetermined reverse setting current flows in the MOS transistor. The control circuit controls ON/OFF of the MOS transistor in response to a control signal reflecting a measured value of the first voltage measuring circuit when the forward drain current flows through the MOS transistor and the current setting voltage level that is set by the correction circuit when the reverse drain current flows in the MOS transistor.

20 Claims, 6 Drawing Sheets

DRIVE CONTROL DEVICE AND DRIVE CONTROL METHOD

CROSS-REFERENCE TO RELATED APPLICATION

This application is based upon and claims the benefit of priority from Japanese Patent Application No. 2016-175046, filed Sep. 7, 2016, the entire contents of which are incorporated herein by reference.

FIELD

Embodiments described herein relate generally to a drive control device and a drive control method.

BACKGROUND

In the related art, a drive control device for a motor detects a current flowing through a MOS transistor forming an H switch that supplies an excitation current to an excitation coil by detecting a voltage generated in a resistor connected to the H switch, and controls ON/OFF of the MOS transistor forming the H switch according to a value of the detected current.

However, power efficiency decreases due to electric power consumed by the resistor, heat is generated due to electric power consumed by the resistor, and cost increases for providing a highly accurate resistor. Therefore, various attempts are performed to detect the excitation current without providing the resistor. A drive control device which can control the excitation current with high accuracy and a control method thereof are desired.

DETAILED DESCRIPTION

An example embodiment provides a drive control device, which can control an excitation current with high accuracy, and a drive control method.

In general, according to one embodiment, a drive control device includes a MOS transistor having a source and drain path connected between a first power supply terminal and a second power supply terminal, first and second voltage measuring circuits, a correction circuit, and a control circuit. The first voltage measuring circuit measures a voltage between a drain and a source of the MOS transistor when a forward drain current flows through the MOS transistor. The second voltage measuring circuit that measures a voltage between the drain and the source of the MOS transistor when a reverse drain current flows in the MOS transistor. The correction circuit sets a current setting voltage level when the reverse drain current flows in the MOS transistor, wherein the current setting voltage level is set based on the measured voltages of the first and second voltage measuring circuits and the current setting voltage level is proportional to a value of the voltage between the drain and the source of the MOS transistor when a predetermined reverse setting current flows in the MOS transistor. The control circuit controls ON/OFF of the MOS transistor in response to a control signal reflecting a measured value of the first voltage measuring circuit when the forward drain current flows through the MOS transistor and the current setting voltage level that is set by the correction circuit when the reverse drain current flows in the MOS transistor.

Hereinafter, a drive control device and a drive control method according to embodiments will be described in detail with reference to the accompanying drawings. These embodiments are not intended to limit the invention.

First Embodiment

Figure 1:
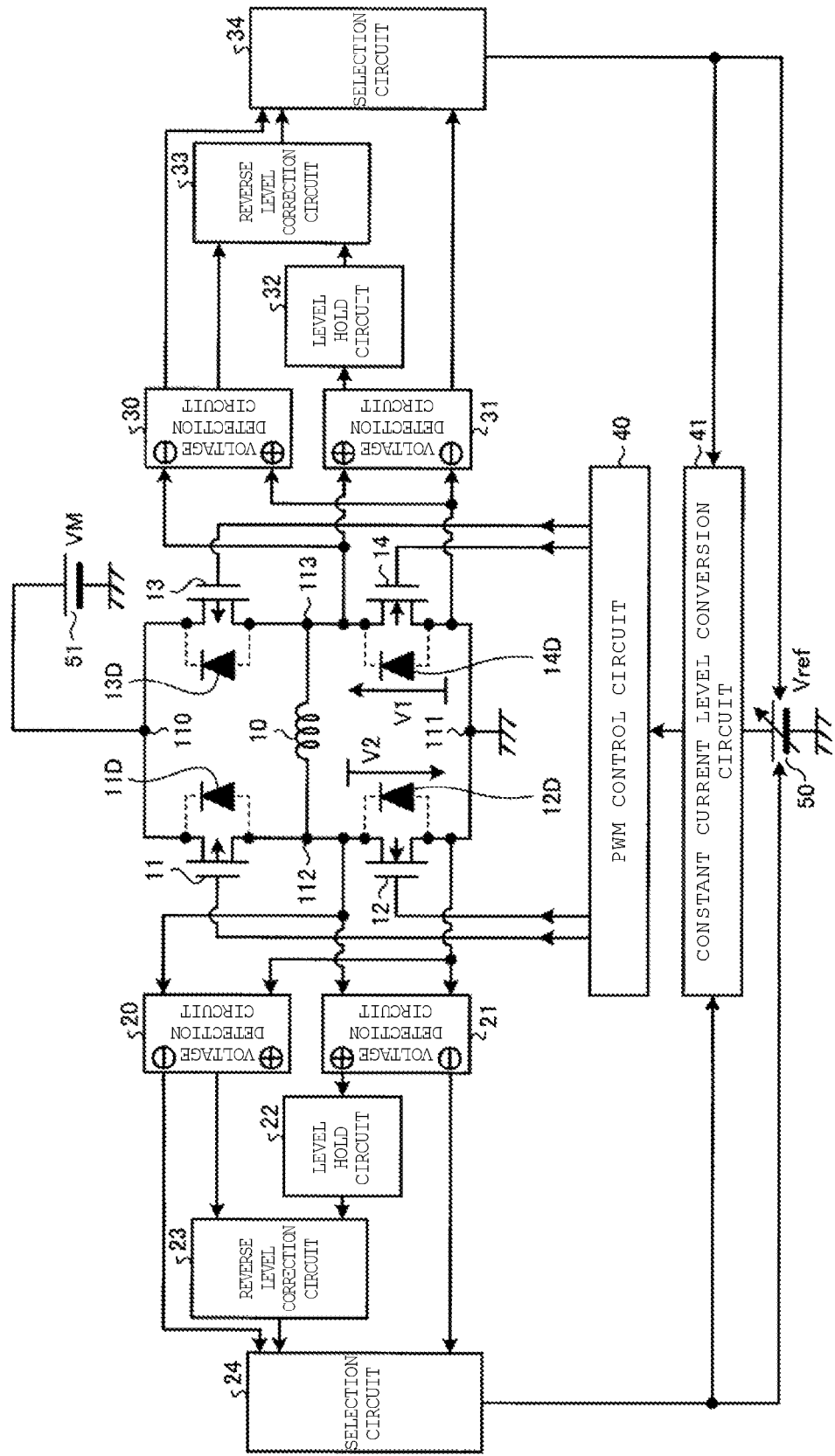
FIG. 1 is a diagram illustrating a configuration of a drive control device of a first embodiment.

FIG. 1 is a diagram illustrating a configuration of a drive control device of a first embodiment. The drive control device of the embodiment has a first power supply terminal 110 and a second power supply terminal 111. The first power supply terminal 110 is connected to a power supply 51 for supplying a voltage VM. The second power supply terminal 111 is grounded.

Source to drain paths of a PMOS transistor 11 and an NMOS transistor 12 are connected in series between the first power supply terminal 110 and the second power supply terminal 111. Similarly, source to drain paths of a PMOS transistor 13 and an NMOS transistor 14 are connected in series between the first power supply terminal 110 and the second power supply terminal 111. An excitation coil 10 is connected between (i) a common connection point 112 between the PMOS transistor 11 and the NMOS transistor 12 and (ii) a common connection point 113 between the PMOS transistor 13 and the NMOS transistor 14. A magnetic field is generated by supplying an excitation current to the excitation coil 10, and rotation of a rotor (not illustrated) of a motor is caused by the generated magnetic field. The PMOS transistor 11, the NMOS transistor 12, the PMOS transistor 13, and the NMOS transistor 14 are arranged as an H-switch for supplying the excitation current to the excitation coil 10.

Each of the MOS transistors (11 to 14) has a parasitic diode (11D to 14D), respectively. Each of the parasitic diodes (11D to 14D) forms a current path in parallel with the source to drain path of the corresponding MOS transistor when the corresponding MOS transistor (11 to 14) has a reverse drain current flowing.

A voltage detection circuit 20 that detects a voltage between a source and a drain based on a drain of the NMOS transistor 12 is provided. The voltage detection circuit 20 measures a voltage V2 between the drain and the source of the NMOS transistor 12 when a reverse drain current flows in the NMOS transistor 12, that is, a drain current flows from the source to the drain of the NMOS transistor 12. The measured value of the voltage detection circuit 20 is supplied to a reverse level correction circuit 23.

A voltage detection circuit 21 that measures a voltage between the drain and the source based on the source of the NMOS transistor 12 is also provided. The voltage detection circuit 21 measures a voltage between the drain and the source of the NMOS transistor 12 when a forward drain current flows through the NMOS transistor 12, that is, a drain current flows from the drain to the source of the NMOS transistor 12. The measured value of the voltage detection circuit 21 is supplied to a level hold circuit 22 and is also supplied to a selection circuit 24. The level hold circuit 22 holds a value of the voltage between the source and the drain of the NMOS transistor 12, for example, when a drain current having a predetermined forward setting current value flows through the NMOS transistor 12. The level hold circuit 22 includes, for example, a sample/hold circuit. An output of the level hold circuit 22 is supplied to the reverse level correction circuit 23.

The reverse level correction circuit 23 compares the output of the voltage detection circuit 20 with the output of the level hold circuit 22, and detects a voltage difference between (i) the voltage between the drain and the source that is generated when the predetermined reverse drain current flows in the NMOS transistor 12 and (ii) the voltage between the drain and the source that is generated when the predetermined forward drain current flows through the NMOS transistor 12. The reverse level correction circuit 23 corrects a current setting voltage level that is set when the predetermined reverse drain current flows with respect to a current setting voltage level when the forward drain current flows, based on the detected voltage difference, and outputs the current setting voltage level. The correction of the current setting voltage level will be described later.

The output of the reverse level correction circuit 23 is supplied to the selection circuit 24. The selection circuit 24 selects one of the outputs of the reverse level correction circuit 23, the voltage detection circuit 21 and the voltage detection circuit 20, and supplies the selected output to a constant current level conversion circuit 41. After the reverse level correction circuit 23 corrects the current setting voltage level, for example, the selection circuit 24 may select the output of the voltage detection circuit 21 when the forward drain current flows through the MOS transistor 12 and select the output of the voltage detection circuit 20 when the reverse drain current flows in the MOS transistor 12.

The constant current level conversion circuit 41 supplies, to a PWM control circuit 40, a control signal for controlling a current value that is supplied to the excitation coil 10 according to an output supplied from the selection circuit 24. A power supply 50 supplies a reference voltage Vref to the constant current level conversion circuit 41. A voltage to which the constant current level conversion circuit 41 responds is changed by changing a value of the reference voltage Vref. For example, a setting voltage level for switching a drive mode of the motor is changed. A value of the reference voltage Vref may be adjusted according to an output signal of the reverse level correction circuit 23 supplied through the selection circuit 24.

The constant current level conversion circuit 41 holds, for example, a direction of the drain current flowing through the NMOS transistor 12 and thus holds the current setting voltage level for switching the drive mode of the motor. The constant current level conversion circuit 41 holds the current setting level according to the current setting voltage level supplied from the reverse level correction circuit 23. The constant current level conversion circuit 41 compares the current setting voltage level that is held and the measured value of the voltage between the drain and the source of the NMOS transistor 12 that is supplied via the selection circuit 24, and supplies the control signal for switching the drive mode to the PWM control circuit 40 based on a comparison result.

The control signal from the constant current level conversion circuit 41 is supplied to the PWM control circuit 40.

The PWM control circuit 40 supplies a PWM signal for controlling ON/OFF of each of the MOS transistors (11 to 14) to a gate of each of the MOS transistors (11 to 14). The PWM control circuit 40 controls an ON time of each of the MOS transistors (11 to 14) according to the control signal from the constant current level conversion circuit 41 to increase or decrease the current value supplied to the excitation coil 10, and controls switching of the drive mode of the motor.

Voltage detection circuits (30 and 31) that measure the voltages between the drain and the source of the NMOS transistor 12 described above, a level hold circuit 32, a reverse level correction circuit 33, and a selection circuit 34 are provided for the NMOS transistor 14. Each of these circuits corresponds to a circuit provided for the NMOS transistor 12.

The voltage detection circuit 30 measures a voltage between a drain and a source based on the source of the NMOS transistor 14. The voltage detection circuit 31 measures the voltage between the source and the drain of the NMOS transistor 14 when a forward drain current flows through the NMOS transistor 14. A measured value of the voltage detection circuit 31 is supplied to the level hold circuit 32 and is also supplied to the selection circuit 34. The level hold circuit 32 holds a value V1 of the voltage between the source and the drain of the NMOS transistor 14, for example, when the drain current having a predetermined setting current value flows through the NMOS transistor 14. An output of the level hold circuit 32 is supplied to the reverse level correction circuit 33.

The reverse level correction circuit 33 compares an output of the voltage detection circuit 30 and the output of the level hold circuit 32, detects a voltage difference between (i) a voltage between the drain and the source that is generated when the reverse drain current flows in the NMOS transistor 14 and (ii) a voltage between the drain and the source that is generated when the forward drain current flows through the NMOS transistor 14, corrects a current setting voltage level that is set when the predetermined reverse drain current flows, and outputs the current setting voltage level.

The output of the reverse level correction circuit 33 is supplied to the selection circuit 34. The selection circuit 34 selects one of the outputs of the reverse level correction circuit 33, the voltage detection circuit 31 and the voltage detection circuit 30, and supplies the selected output to the constant current level conversion circuit 41 and the power supply 50. The selection operations of the selection circuits (24 and 34) are performed, for example, under the control of the PWM control circuit 40.

The constant current level conversion circuit 41 supplies, to the PWM control circuit 40, the control signal for controlling the current value supplied to the excitation coil 10 according to the output supplied from the selection circuit 34. The power supply 50 supplies the reference voltage Vref to the constant current level conversion circuit 41. A voltage to which the constant current level conversion circuit 41 responds is changed by changing the reference voltage Vref. For example, the setting voltage level for switching the drive mode of the motor is changed. The value of the reference voltage Vref may be adjusted according to the output signal of the reverse level correction circuit 33 supplied from the selection circuit 34.

The constant current level conversion circuit 41 holds, for example, the direction of the drain current flowing through the NMOS transistor 14 and thus holds the current setting voltage level for switching the drive mode of the motor. The constant current level conversion circuit 41 holds the current setting level according to the current setting voltage level supplied from the reverse level correction circuit 33. The constant current level conversion circuit 41 compares the current setting voltage level that is held and the measured value of the voltage between the drain and the source of the NMOS transistor 14 that is supplied via the selection circuit 34, and supplies the control signal for switching the drive mode to the PWM control circuit 40 based on the comparison result.

According to the first embodiment, the voltage between the drains and the sources when the predetermined forward drain current flows through the MOS transistor (11 to 14) configuring the H switch that supplies the excitation current to the excitation coil 10 and that when the reverse drain current flows in the MOS transistor (11 to 14) are detected, and the current setting voltage level when the reverse current flows through the MOS transistor is corrected by reflecting the difference. That is, a difference between (i) forward voltage and current characteristics of the MOS transistor and (ii) reverse voltage and current characteristics of the MOS transistor is detected, and the current setting voltage level in the drive mode in which the reverse drain current flows is corrected according to the detection result. Therefore, it is possible to control the excitation current with high accuracy. Since the current detection is performed by measuring the voltage between the drain and the source of the MOS transistor, it is not necessary to additionally provide a resistor for the current detection. Therefore, it is possible to reduce power consumption by the resistor, heat generation in the resistor, and a cost due to provision of the resistor.

In addition, it is also possible to measure the voltages between the drain and the source of the PMOS transistors (11 and 13). Similar to the measurement of the voltages between the drain and the source of the NMOS transistors (12 and 14), a difference between (i) a voltage between the drain and the source when the forward drain current flows and that when the reverse drain current flows is detected, and the current setting voltage level when the reverse drain current flows in the PMOS transistor (11 and 13) is corrected by reflecting the difference, and thereby similarly, it is possible to control the drive current with high accuracy. In addition, instead of the PMOS transistors (11 and 13), the H switch may be configured using the NMOS transistors.

Figure 2:
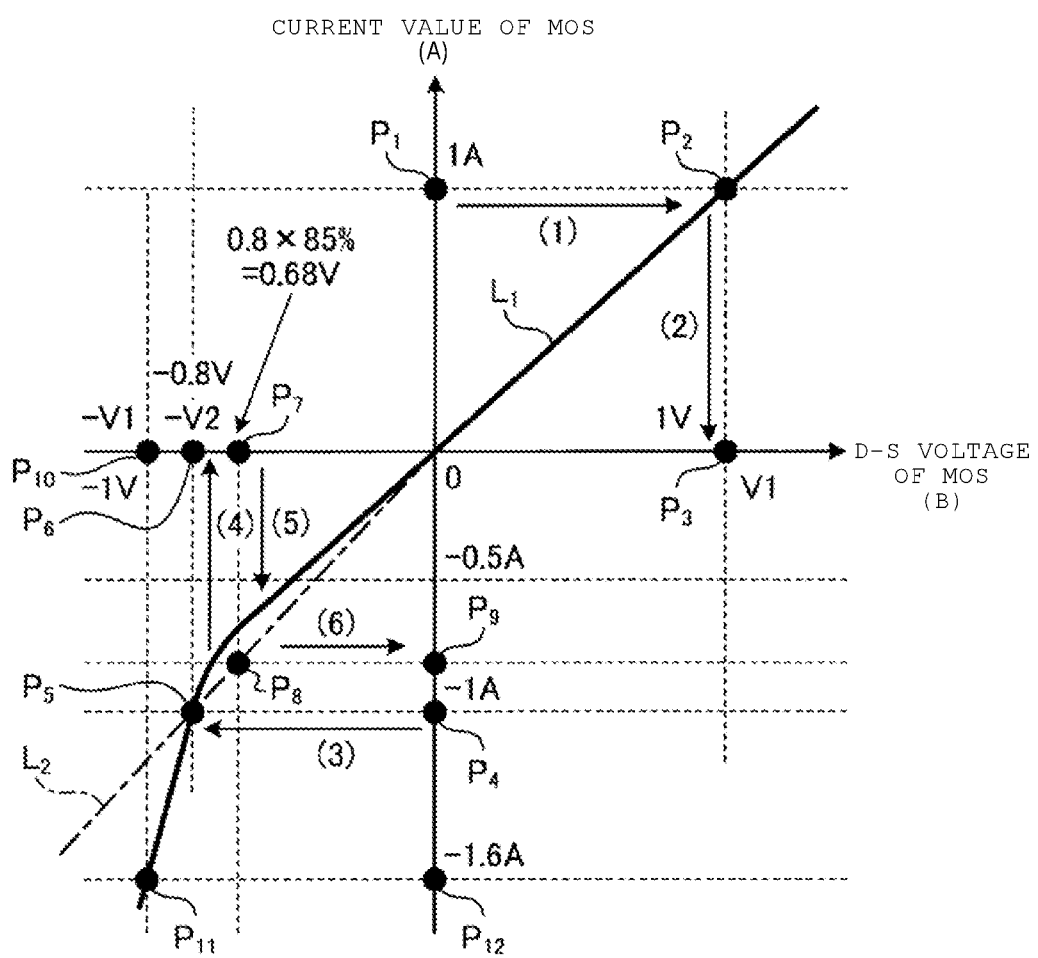
FIG. 2 is a diagram for explaining one method for correcting a current setting voltage level.

FIG. 2 is a diagram for explaining one method for correcting the current setting voltage level for the NMOS transistor 12. A horizontal axis of the drawing indicates the voltage between the drain and the source, and a vertical axis of the drawing indicates the drain current.

In FIG. 2, a first quadrant indicates a case where the forward drain current flows through the NMOS transistor 12. In a state where the forward drain current flows through the NMOS transistor 12, the current equivalently flows through an ON resistance (Ron) of the NMOS transistor 12. Therefore, in the first quadrant, the drain current is proportional to the voltage between the drain and the source. In other words, it is possible to detect the drain current flowing through the NMOS transistor 12 by detecting the voltage between the drain and the source and dividing the voltage by the ON resistance (Ron). For example, the voltage between the drain and the source at a point $P_3$ is 1 V. The point $P_3$ is obtained in the following manner. That is, a point is moved horizontally from a point $P_1$ having the drain current of 1 A (arrow (1)) and intersects with a current and voltage characteristic line $L_1$ of the NMOS transistor 12 at a point $P_2$. Then, the point is vertically moved (arrow (2)) from the point $P_2$ and intersects with the horizontal axis at a point $P_3$.

In FIG. 2, a third quadrant indicates a case where the reverse drain current flows. When the reverse drain current flows, a current also flows through the parasitic diode 12D. Therefore, compared to a case of the forward drain current, a value (absolute value) of the drain current is large with respect to the voltage between the drain and the source having the same absolute value. For example, the value of the reverse drain current is 1.6 A at the voltage V1 (1V) between the drain and the source having the same absolute value. In other words, the voltage between the drain and the source through which the reverse drain current having the same absolute value flows is smaller.

For example, when the forward drain current of 1 A flows, the voltage V1 between the source and the drain of the NMOS transistor 12 is 1 V, while voltage (−V2) which is indicated by a point $P_6$ is −0.8 V (point $P_6$). The point $P_6$ is obtained in the following manner. That is, a point is horizontally moved (arrow (3)) from a point $P_4$ indicating a drain current of the reverse drain current (−1 A) and intersects with the current and voltage characteristic line $L_1$ at a point $P_5$. The point is further moved vertically (arrow (4)) from the point $P_5$ and intersects with the horizontal axis at the point $P_6$. On the other hand, for example, the reverse drain current (point $P_{12}$) of 1.6 A flows at a point $P_{11}$ at which a point $P_{10}$ indicating −1 V intersects the current and voltage characteristic line $L_1$.

That is, when the current having the same absolute value, that is, 1 A flows, a voltage difference of 0.2 V is generated in the voltage between the drain and the source in the forward direction and the reverse direction. The current setting voltage level that is set when the predetermined reverse drain current flows is corrected in consideration of the voltage difference that is generated when the drain current flows in the forward direction and the reverse direction.

For example, a correction current and voltage characteristic line $L_2$ is generated using a straight line that is obtained by connecting the point $P_5$ and the origin based on the point $P_5$ indicating a state where the reverse drain current of 1 A flows, and is set as a correction characteristic line with a slope of 0.8 V/1 A, in a state where the reverse drain current flows. Specifically, the current setting voltage level is set depending on a value that is specified on the correction current and voltage characteristic line $L_2$. For example, if a current setting voltage is set for causing the current of 0.85 A to flow, a voltage obtained by multiplying the voltage of 0.8 V when 1 A flows by 0.85, that is, 0.68 V (=slope×0.85 A) (point $P_7$) is a value of the current setting voltage corresponding to a setting current of 0.85 A. A current value of a point $P_9$ is a value of a setting current corresponding to a current setting voltage point $P_7$. The point $P_9$ is obtained in the following manner. That is, a point is moved vertically (arrow (5)) and intersects with the correction current and voltage characteristic line $L_2$. Then, the point is further moved horizontally (arrow (6)) from the intersection point (point $P_8$) and intersects with the vertical axis at the point $P_9$. When 0.68 V is detected as the voltage between the source and the drain of the NMOS transistor 12, 0.85 A is considered to be detected, and for example, control to switch the operation mode is performed.

According to the correction method, the correction current and voltage characteristic line $L_2$ is obtained by using the straight line connecting the point $P_5$ and the origin, which is a line that is determined by the value (point $P_4$) of the drain current in the reverse direction has the same absolute value as that of the drain current in the forward direction and the voltage (point $P_6$) between the drain and the source under this condition. Control is performed by setting the current setting voltage level when a predetermined reverse drain current flows by a value specified on the correction current and voltage characteristic line $L_2$. Since the correction current and voltage characteristic line $L_2$ is a characteristic line with a correction value obtained by reflecting the difference of the voltage and current characteristics in the forward direction and the reverse direction, it is possible to control the drive current with high accuracy. In addition, a peak value of the excitation current may be used as the current value (point $P_4$) of the starting point $P_5$ for generating the correction current and voltage characteristic line $L_2$. The current setting voltage level is proportionally distributed according to a ratio between the peak value of the excitation current and a setting current value to be switched to various drive modes. Therefore, it is possible to easily calculate the current setting voltage level (=voltage of the horizontal axis) that is specified by the correction current and voltage characteristic line $L_2$.

Figure 3A:
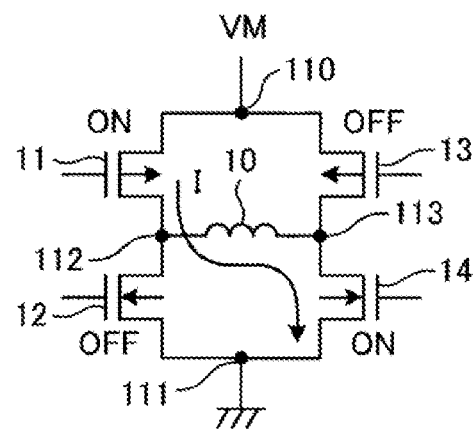
FIGS. 3A to 3C are diagrams for explaining a motor drive mode.
Figure 3B:
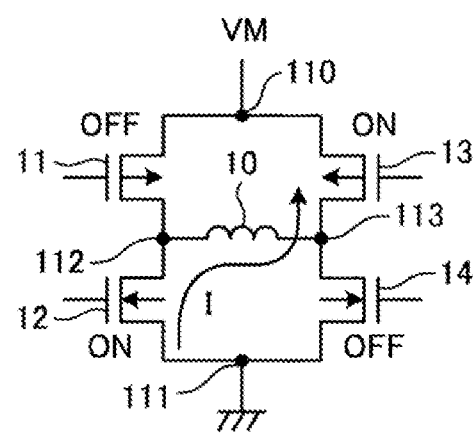
Figure 3C:
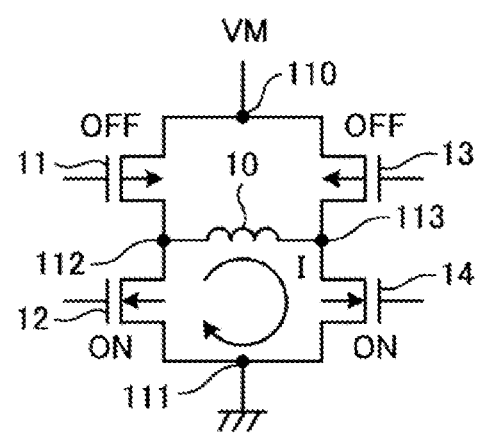

FIGS. 3A to 3C are drawings for explaining an operation of the MOS transistors (11 to 14) configuring an H bridge circuit that is controlled by a PWM signal from the PWM control circuit 40. FIG. 3A illustrates a case where the PMOS transistor 11 and the NMOS transistor 14 are in an ON state. In this state, a current flows from the first power supply terminal 110 through the coil 10, that is, electric current charges the excitation coil 10 from the power supply 51. Hereinafter, the mode is referred to as a charge mode.

A state of FIG. 3B illustrates a case where the NMOS transistor 12 and the PMOS transistor 13 are in the ON state. In this state, a current flows through the coil 10 to the first power supply terminal 110. In this state, electric current discharges the excitation coil 10. Hereinafter, this mode is referred to as a discharge mode.

A state of FIG. 3C illustrates a case where the NMOS transistor 12 and the NMOS transistor 14 are in the ON state. In this case, the coil 10 current is slowly discharged via a loop formed by the NMOS transistor 12 and the NMOS transistor 14 of the ON state. Hereinafter, this mode is referred to as a low speed discharge mode.

Figure 4:
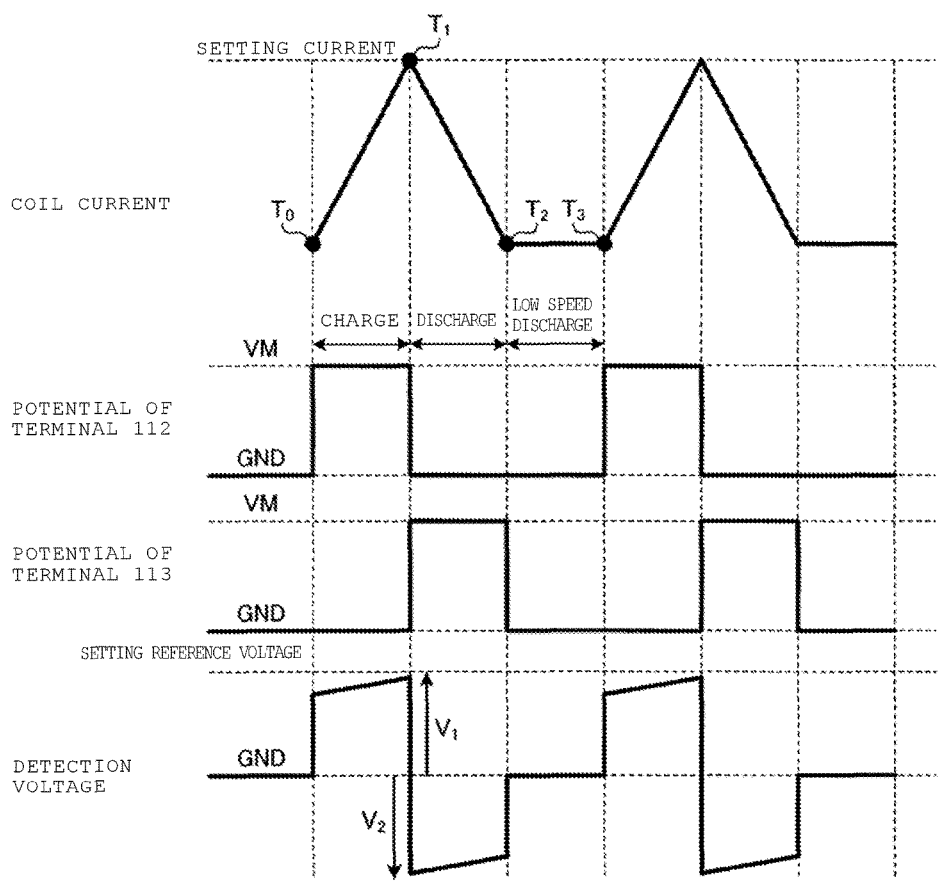
FIG. 4 is a diagram for explaining a state of an excitation current and voltages in each motor drive mode.

FIG. 4 is a diagram for explaining a state of the excitation current (coil current) flowing through a coil and voltages in each mode. The uppermost waveform indicates the coil current. A period from a time $T_0$ to a time $T_1$ is the charge mode. A period from the time $T_1$ to a time $T_2$ is the discharge mode. A period from the time $T_2$ to time $T_3$ is the low speed discharge mode.

The potential of the terminal 112 is a voltage VM in the period of the charge mode, that is, a period in which the PMOS transistor 11 is turned on, and is a ground potential GND in the discharge period, that is, a period in which the NMOS transistor 12 is turned on. Similarly, the potential of a terminal 113 is the ground potential GND in the charge period, that is, a period in which the NMOS transistor 14 is turned on, and is the voltage VM in the discharge period, that is, a period in which the PMOS transistor 13 is turned on. Detection voltages, that is, the voltage $V_1$ between the drain and the source of the NMOS transistor 14 and the voltage between the drain and the source of the NMOS transistor 12 are detected as the voltage $V_1$ in a state where the forward drain current flows and the voltage $V_2$ in a state where the reverse drain current flows at the time $T_1$ when the mode is switched from the charge mode to the discharge mode. As described above, the voltage difference between $V_1$ and $V_2$ is generated due to the parasitic diode in a state where currents having the same absolute value flow.

Figure 5:
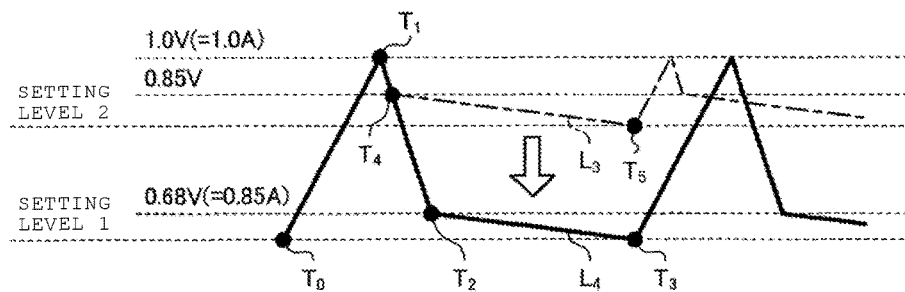
FIG. 5 is a diagram for explaining a relationship between a current setting voltage level and the excitation current in each motor drive mode.

FIG. 5 is a diagram for explaining a relationship between the current setting voltage level and the excitation current in each drive mode. For example, the mode is switched from the charge mode to the discharge mode at the time $T_1$ when the excitation current is 1 A. A current value for switching from the discharge mode to the low speed discharge mode is, for example, set to 0.85 A.

In the discharge mode, the reverse drain current flows in the NMOS transistor 12. In the drive control device of the embodiment, as described above, the current setting voltage level corresponding to the setting current in a state where the reverse drain current flows is set by using the correction current and voltage characteristic line $L_2$ reflecting the voltage difference between the drain and the source when the forward drain current flows and when the reverse drain current flows. More specifically, for example, the voltage between the source and the drain when the reverse drain current of 1 A flows is measured, the measured value, for example, 0.8 V is set as a reference, and 0.68 V that is 0.85 times the reference value is set as the current setting voltage level for switching to the low speed discharge mode. That is, the mode is switched from the discharge mode to the low speed discharge mode at the time $T_2$ when the voltage between the source and the drain of the NMOS transistor 12 is 0.68 V.

If 0.85 V is the setting voltage for switching to the low speed discharge mode using the voltage of 1 V between the source and the drain through which the forward drain current of 1 A flows without considering the difference in voltages between the drain and the source when the reverse drain current flows and when the forward drain current flows, as indicated by a line $L_3$, at time $T_4$ immediately after switching from the charge mode to the discharge mode, the mode is erroneously switched to the low speed discharge mode. Similarly, the mode is erroneously switched from the low speed discharge mode to the charge mode at time $T_5$ at which a value of a current setting voltage level 2 is reached.

That is, when the mode is switched to the discharge mode at the timing $T_1$ at which the forward drain current is 1 A, since the reverse drain current of 1 A of which the absolute value is the same as that of the drain current, the voltage between the drain and the source of the NMOS transistor 12 is 0.8 V. Therefore, in this state, since the voltage between the drain and the source is already smaller than the setting voltage 0.85 V, the mode is switched from the discharge mode to the low speed discharge mode at the timing $T_4$ despite the fact that the reverse drain current of 1 A flows. Therefore, a relatively large current flows during the period of the low speed discharge mode and there is a concern that abnormal of heat generation or the like occurs. Similarly, the mode is switched from the low speed discharge mode to the charge mode at the timing $T_5$ at which the current setting voltage level 2 is reached.

In the embodiment, the mode is switched at time $T_2$ at which the setting voltage in a state where the reverse drain current flows has a setting voltage of 0.68 V based on the correction current and voltage characteristic line $L_2$. Therefore, the excitation current flowing in the low speed discharge mode can be suppressed to a predetermined small current indicated by a current line $L_4$. A value of a current setting voltage level 1 for switching from the low speed discharge mode to the charge mode is also set by using the correction current and voltage characteristic line $L_2$ described above.

Second Embodiment

Figure 6:
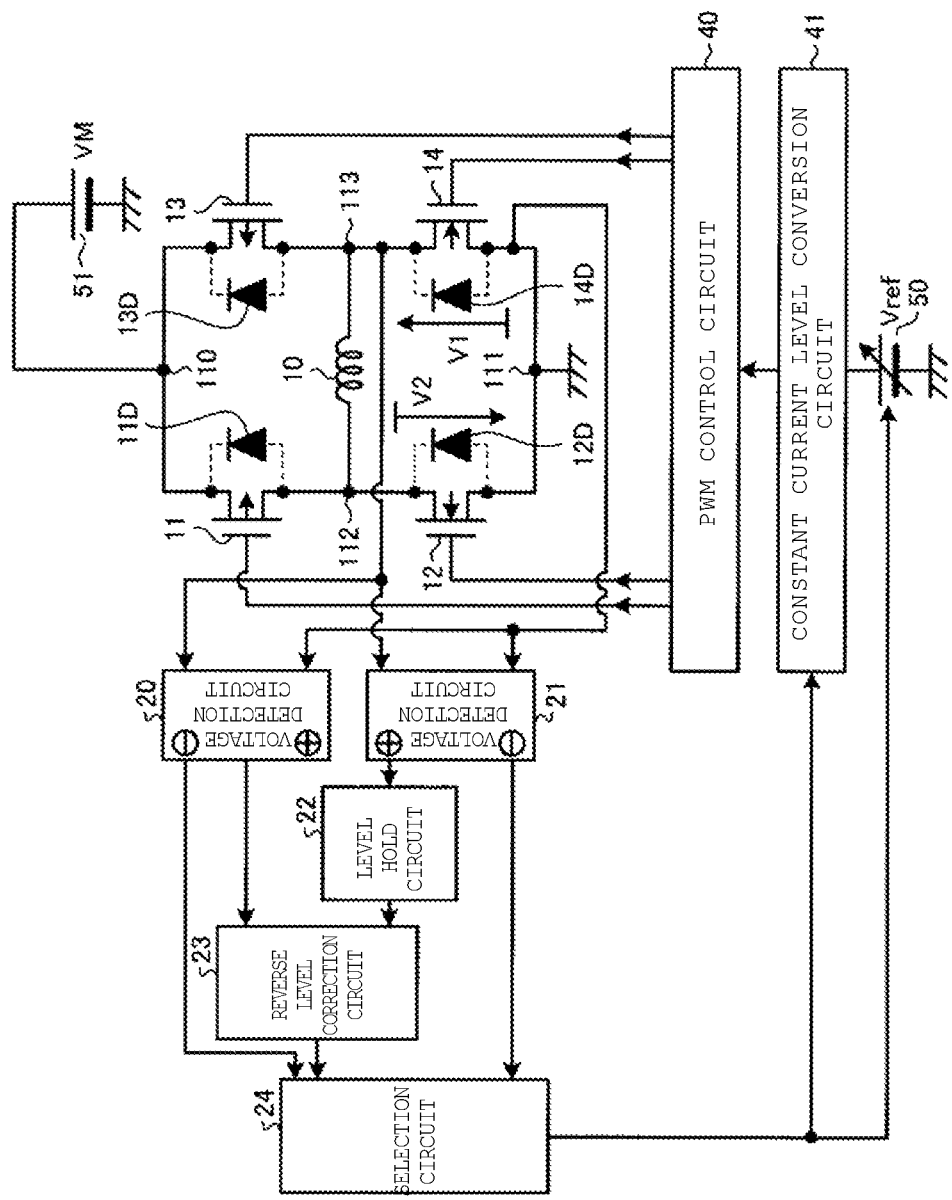
FIG. 6 is a diagram illustrating a configuration of a drive control device of a second embodiment.

FIG. 6 is a diagram illustrating a configuration of a drive control device of a second embodiment. The same reference numerals are given to configuration elements corresponding to those of the embodiment described above and duplicated description is made only if necessary. In the embodiment, a voltage detection circuit 21 detects a voltage between a drain and a source of an NMOS transistor 14. An output of a voltage detection circuit 21 is supplied to the level hold circuit 22.

If dimensions of elements of an NMOS transistor 12 and the NMOS transistor 14 are equal to each other, the same transistor characteristics are obtained. Therefore, a voltage V1 between the drain and the source when a predetermined forward drain current flows through the NMOS transistor 14 is detected by the voltage detection circuit 21 and this is equivalent to detecting the voltage between the drain and the source when the predetermined forward drain current flows through the NMOS transistor 12.

Since an excitation coil 10 operates to cause the same current to flow when switching from a charge mode to a discharge mode, it can be handled as the excitation current flowing through the excitation coil 10 being equal when the mode is switched. That is, a current of a value equal to a predetermined excitation current flowing through the NMOS transistor 14 flows through the NMOS transistor 12 as a reverse drain current when the mode is switched to the discharge mode.

Therefore, it is possible to detect the voltage between the drain and the source when the reverse current equal to the predetermined forward drain current flowing through the NMOS transistor 14 when the mode is switched to the discharge mode flows through the NMOS transistor 12 by detecting the voltage V2 between the drain and the source of the NMOS transistor 12 immediately after switching to the discharge mode.

In this case, a voltage V2 between the drain and the source of the NMOS transistor 12 is detected by the voltage detection circuit 20 and the correction described above is performed. Therefore, it is possible to perform correction of a current setting voltage level when the reverse drain current flows in the NMOS transistor 12.

According to the embodiment, the voltage detection circuit 21 that detects the voltage between the drain and the source when the forward drain current flows through the NMOS transistor 14 and the voltage detection circuit 20 that detects the voltage between the drain and the source thereof when the reverse drain current flows in the NMOS transistor 12 are provided, and the voltage detection circuits (30 and 31), the level hold circuit 32, the reverse level correction circuit 33, and the selection circuit 34 in the embodiment of FIG. 1 are omitted. Therefore, it is possible to reduce the number of circuit elements.

Third Embodiment

Figure 7:
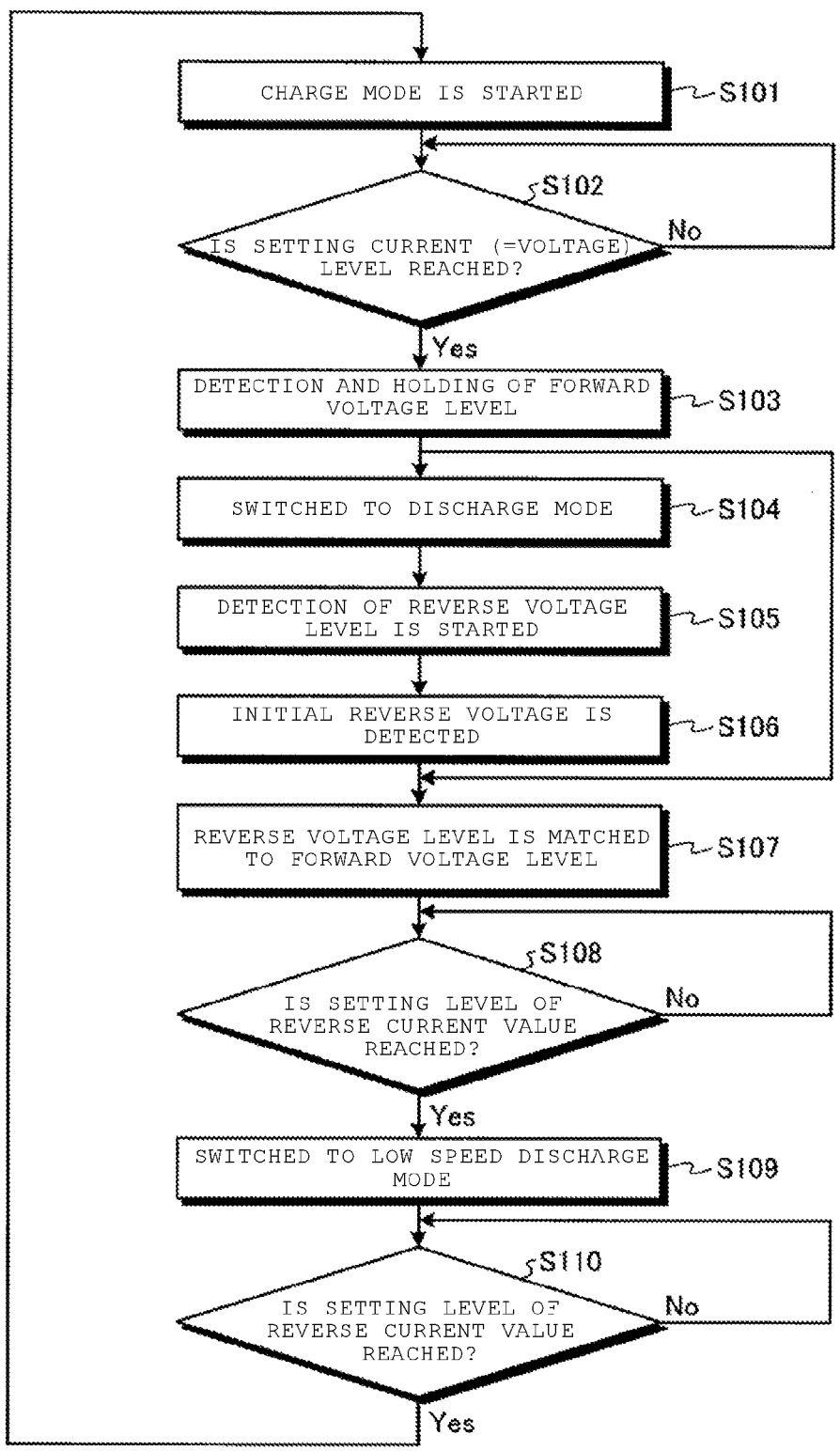
FIG. 7 is a flowchart illustrating a drive control method.

FIG. 7 is a flowchart illustrating an operation of the drive control device according to one embodiment. A charge mode is started (S101). It is determined whether or not a current flowing through an excitation coil 10 reaches a predetermined setting current level (S102). Whether or not the current reaches the predetermined setting current level is performed by determining whether or not a voltage between a drain and a source of an NMOS transistor 14 reaches a predetermined current setting voltage level.

If the current reaches the predetermined setting current level (S102: Yes), the voltage between the drain and the source at this time is detected and a voltage value thereof is held by a level hold circuit 32 (S103). If the current does not reach the predetermined setting current level (S102: No), the detection is continued. In addition, the voltage between the drain and the source of the NMOS transistor 12 when a predetermined setting current flows is detected in advance and the voltage value may be held in the level hold circuit 32.

The mode is switched to a discharge mode (S104). Detection of the voltage between the drain and the source of the NMOS transistor 12 through which the reverse drain current flows is started (S105). An initial voltage immediately after detection start is detected (S106). Immediately after the mode is switched, a current having the same value flows through the excitation coil 10. Therefore, it is possible to detect a difference in the voltage between the drain and the source of the NMOS transistor 14 before and after mode switching, that is, a difference between (i) the voltage between the drain and the source when the forward drain current flows and (ii) the voltage between the drain and the source of the NMOS transistor 12, that is, the voltage between the drain and the source when the reverse drain current flows.

Correction for matching the voltage between the drain and the source when the reverse drain current flows to the voltage between the drain and the source when the forward drain current flows is performed (S107). That is, as described above, the correction of the current setting voltage level that is set in a state where the reverse drain current flows is performed. For example, as described above, if the voltage between the drain and the source when a predetermined forward drain current I flows is V1 and the voltage between the drain and the source when the reverse drain current having the same absolute value flows is V2, setting of a voltage level for setting the reverse drain current is corrected to the current setting voltage level in which the current I flows in the voltage V2. That is, in a state where the reverse drain current flows, control is performed at a setting level different from the current setting voltage level that is set in a state where the forward drain current flows.

When the value of the reverse drain current reaches the setting level (S108: Yes), the mode is switched to a low speed discharge mode (S109). When the reverse drain current value does not reaches the setting level (S108: No), the detection is continued. The detection of the reverse drain current is performed based on the value of the current setting voltage level in which the correction described above is performed.

When the value of the reverse drain current reaches the setting level (S110: Yes), the mode is shifted to the charge mode (S101). When the value of the reverse drain current does not reach the setting level (S110: No), the detection is continued. Similarly, the detection of the reverse drain current is performed based on the value of the current setting voltage level in which the correction described above is performed.

According to the drive control method of the embodiment, the setting value of the current setting voltage level for switching the mode in a state where the reverse drain current flows is set based on the voltage level in which the correction for matching the voltage between the drain and the source when the reverse drain current flows to the voltage between the drain and the source when the forward drain current flows is performed. Therefore, it is possible to perform the control of the drive current with high accuracy by reflecting the difference in the voltages between the drain and the source of the MOS transistor when the forward drain current flows and when the reverse drain current flows. Since the control for detecting the voltage between the drain and the source the MOS transistor is performed, there is no need to provide a resistor for current detection, and it is possible to reduce power consumption, heat generation in the resistor, and a cost by the resistor.

A case of the H switch that supplies the excitation current to the excitation coil 10 is described, but the exemplary embodiment is not limited to the case. The exemplary embodiment can be widely used in a configuration in which ON/OFF of the MOS transistor is controlled by detecting the voltage between the drain and the source thereof. When the forward drain current flows through the MOS transistor, the current setting voltage that is set based on the linearly changing voltage and current characteristic line that is determined by the ON resistor (Ron) of the MOS transistor is compared to the detected voltage between the drain and the source of the MOS transistor. Therefore, for example, switching from the mode in which the forward drain current flows to the mode in which the reverse drain current flows is performed and the control in a state where the reverse drain current flows can be performed by detecting whether or not the detected voltage between the drain and the source reaches a predetermined current setting voltage level that is set depending on a value specified on the correction characteristic line.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A drive control device comprising:
   a MOS transistor that has a source to drain path connected between a first power supply terminal and a second power supply terminal;
   a first voltage measuring circuit that measures a voltage between a drain and a source of the MOS transistor when a forward drain current flows through the MOS transistor;
   a second voltage measuring circuit that measures a voltage between the drain and the source of the MOS transistor when a reverse drain current flows in the MOS transistor;
   a correction circuit that sets a current setting voltage level when the reverse drain current flows in the MOS transistor, wherein the current setting voltage level is set based on the measured voltages of the first and second voltage measuring circuits and the current setting voltage level is proportional to a value of the voltage between the drain and the source of the MOS transistor when a predetermined reverse setting current flows in the MOS transistor; and
   a control circuit that controls ON/OFF of the MOS transistor in response to a control signal reflecting a measured value of the first voltage measuring circuit when the forward drain current flows through the MOS transistor and the current setting voltage level that is set by the correction circuit when the reverse drain current flows in the MOS transistor.

2. The device according to claim 1, wherein the correction circuit calculates a correction value for setting the current setting voltage level based on the value of the voltage between the drain and the source of the MOS transistor when the predetermined reverse setting current flows in the MOS transistor.

3. The device according to claim 1, wherein the current setting voltage level is based on a predetermined peak current that occurs when the forward drain current flows in the MOS transistor.

4. The device according to claim 1, further comprising a coil, wherein
   the forward drain current flows through the MOS transistor when the coil is charged.

5. The device according to claim 1, further comprising a coil, wherein
   the reverse drain current flows in the MOS transistor when the coil is discharged.

6. The device according to claim 1, further comprising
   a selection circuit that provides at an output thereof a selected one of the correction circuit output, the first voltage measuring circuit output and the second voltage measuring circuit output; and
   a constant current level conversion circuit that receives the selected output from the selection circuit to provide the control signal to the control circuit.

7. The device according to claim 1, further comprising a level hold circuit that holds a value of the source to drain voltage of the MOS transistor when a predetermined forward drain current flows through the MOS transistor.

8. The device according to claim 7, wherein the correction circuit compares the output of the second voltage measuring circuit with an output of the level hold circuit to provide the current setting voltage level to the selection circuit.

9. A drive control device comprising:
   a first power supply terminal;
   a second power supply terminal;
   a first connection end;
   a second connection end;
   a first MOS transistor having a source to drain path that is connected between the first power supply terminal and the first connection end;
   a second MOS transistor having a source to drain path that is connected between the first connection end and the second power supply terminal;
   a third MOS transistor having a source to drain path that is connected between the first power supply terminal and the second connection end;
   a fourth MOS transistor having a source and drain path that is connected between the second connection end and the second power supply terminal;
   an excitation coil that is connected between the first connection end and the second connection end;
   a first voltage measuring circuit that measures a voltage between the drain and the source of the second MOS transistor;
   a second voltage measuring circuit that measures a voltage between the drain and the source of the fourth MOS transistor;
   a PWM control circuit that supplies a PWM signal for switching the first to fourth MOS transistors ON and OFF; and
   a constant current level conversion circuit that supplies a control signal to the PWM control circuit for switching an operation state of ON/OFF of the first to fourth MOS transistors in response to a measured value of the first voltage measuring circuit when a reverse drain current flows in the second MOS transistor and in response to a measured value of the second voltage measuring circuit when a forward drain current flows through the fourth MOS transistor.

10. The device according to claim 9, further comprising:
a correction circuit that establishes a correction value for setting the current setting voltage level that linearly changes until a value of the predetermined setting current is reached.

11. The device according to claim 10, further comprising a selection circuit that provides at an output a selected one of the correction circuit output, the first voltage measuring circuit output and the second voltage measuring circuit output,
wherein the constant current level conversion circuit receives the selected output from the selection circuit to provide the control signal to the control circuit.

12. The device according to claim 11,
wherein the constant current level conversion circuit receives an adjustable reference voltage; and
wherein the selection circuit provides an output to an adjustable reference voltage.

13. The device according to claim 10, further comprising a level hold circuit that holds a value of the source to drain voltage of the MOS transistor when a predetermined forward drain current flows through the MOS transistor.

14. The device according to claim 13, wherein the correction circuit compares the output of the second voltage measuring circuit with an output of the level hold circuit to provide the current setting voltage level to the selection circuit.

15. The drive control method according to claim 13, wherein issuing the control signal changes a mode from discharge mode to low speed discharge mode.

16. The drive control method according to claim 15, wherein the MOS transistor in the discharge mode has a higher reverse drain current than the low speed discharge mode.

17. The drive control method according to claim 13, wherein issuing the control signal changes a mode from a low speed discharge mode to a charging mode.

18. The drive control method according to claim 17, wherein the MOS transistor in the charging mode reaches a predetermined peak current.

19. The drive control method according to claim 18, wherein the current setting voltage level is based on the predetermined peak current.

20. A drive control method comprising:
detecting a voltage between a drain and a source of a MOS transistor when a forward drain current flows through the MOS transistor having a source to drain path that is connected in series between a first power supply terminal and a second power supply terminal;
detecting a first voltage that is generated between the drain and the source of the MOS transistor when a predetermined reverse setting current flows in the MOS transistor;
obtaining, from the first voltage and the predetermined setting current, a correction value which is based on the voltage between the drain and the source of the MOS transistor when the predetermined reverse setting current flows in the MOS transistor;
setting a current setting voltage level when a predetermined reverse drain current flows in the MOS transistor based on a value that is determined by the correction value; and
issuing a control signal in a state while a reverse drain current flows in the MOS transistor according to a comparison result between the current setting voltage level and the voltage between the drain and the source of the MOS transistor.

* * * * *